United States Patent
Vakil

(10) Patent No.: US 6,495,271 B1
(45) Date of Patent: Dec. 17, 2002

(54) SPALLATION-RESISTANT PROTECTIVE LAYER ON HIGH PERFORMANCE ALLOYS

(75) Inventor: Himanshu Bachubhai Vakil, Schenectady, NY (US)

(73) Assignee: General Electric Company, Schenectady, NY (US)

( * ) Notice: Subject to any disclaimer, the term of this patent is extended or adjusted under 35 U.S.C. 154(b) by 259 days.

(21) Appl. No.: 09/654,125

(22) Filed: Sep. 1, 2000

Related U.S. Application Data

(60) Continuation-in-part of application No. 09/253,918, filed on Feb. 22, 1999, now abandoned, which is a division of application No. 08/024,034, filed on Mar. 1, 1993, now Pat. No. 5,902,638.

(51) Int. Cl.[7] .......................... B32B 15/01; B32B 15/04; B32B 15/20

(52) U.S. Cl. ....................... 428/632; 428/613; 428/629; 428/650; 428/651; 428/652; 428/670; 428/678; 416/241 R; 427/250

(58) Field of Search ................ 428/632, 547, 428/548, 575, 600, 601, 609, 613, 615, 621, 628, 629, 630, 633, 650, 651, 652, 653, 654, 668, 670, 678, 680, 681, 687, 332, 334, 701, 936, 550, 215, 689, 702; 427/248.1, 250, 255.7, 419.1, 419.2, 314, 372.2, 585; 416/241 R, 241 B, 223 A

(56) References Cited

U.S. PATENT DOCUMENTS

| | | | |
|---|---|---|---|
| 3,677,789 A | 7/1972 | Bungardt | 117/22 |
| 4,132,816 A | 1/1979 | Benden et al. | 427/327 |
| 4,414,249 A | 11/1983 | Ulion et al. | 427/248.1 |
| 4,457,948 A * | 7/1984 | Ruckle et al. | 427/34 |
| 4,675,089 A | 6/1987 | Lory et al. | 204/164 |
| 4,880,614 A | 11/1989 | Strangman et al. | 428/623 |
| 5,015,502 A | 5/1991 | Strangman et al. | 427/248.1 |
| 5,238,752 A | 8/1993 | Duderstadt et al. | 428/623 |
| 5,498,484 A | 3/1996 | Duderstadt | 428/633 |
| 5,514,482 A | 5/1996 | Strangman | 428/623 |
| 5,843,585 A | 12/1998 | Alperine et al. | 428/623 |
| 6,103,386 A * | 8/2000 | Raybould et al. | 428/472 |
| 6,203,927 B1 * | 3/2001 | Subramanian et al. | 428/623 |

OTHER PUBLICATIONS

Morosanu, "Thin films by Chemical Vapour Deposition", Elsevier, Amsterdam (1990) pp. 429–430 and 445 (no month).

Kirk Othmer, Encyclopedia of chemical Technology, vol. 5 (1993), p. 640 (no month).

"Delamination and Fracture of Thin Films", by Erik Klokholm, IBM J. Res. Develop. Vol. 31, No. 5 (Sep. 1987), pp. 585–591.

"The Cracking and Decohesion of Thin Films", by A. G. Evans, M.D. Drory and M.s. Hu, J. Mater. Res., vol. 3, No. 5, (Sep./Oct. 1988), pp. 1044–1049.

* cited by examiner

Primary Examiner—Deborah Jones
Assistant Examiner—Michael La Villa
(74) Attorney, Agent, or Firm—Noreen C. Johnson; Philip D. Freedman

(57) ABSTRACT

A method for producing a spallation-resistant aluminum oxide layer on the surface of a superalloy article is described. An aluminum oxide layer is produced, typically under tensile stress, by chemical vapor deposition at low temperatures on a metal aluminide layer that has been deposited on the surface of the article. The aluminum oxide layer is then heated to induce cracking therein, which imparts spallation-resistance thereto. If desired, a thermal barrier layer may be deposited on the aluminum oxide layer.

20 Claims, 1 Drawing Sheet

SPALLATION-RESISTANT PROTECTIVE LAYER ON HIGH PERFORMANCE ALLOYS

This patent application is a continuation-in-part of application Ser. No. 09/253,918 filed on Feb. 22, 1999, now abandoned, which is a division of application Ser. No. 08/024,034, filed on Mar. 1, 1993, now U.S. Pat. No. 5,902,638.

BACKGROUND OF THE INVENTION

The present invention relates to producing adherent and oxidation resistant coatings on superalloys, and more particularly, to aluminide coatings having a spallation-resistant alumina layer therein.

High performance superalloys, such as nickel- or cobalt-based superalloys, are being increasingly employed in various types of gas turbine engines used, for example, in the propulsion and power generation industries. High pressure components (e.g., airfoils) of high performance and high fuel efficiency turbine engines generally have a hollow core made of a nickel-or cobalt-based superalloy. These components are subjected to corrosive exhaust gases at extremely high temperatures of up to 1150° C. during the operation of a gas turbine engine. As a result, these components are prone to oxidation damage. Various solutions have been tried to prevent such oxidation damage.

One means typically employed is to provide the components with an environmentally-resistant coating, often provided by an aluminum-rich alloy, such as aluminide, whose surface oxidizes to form an aluminum oxide (alumina) scale at elevated temperatures. Such a scale provides a tough, adherent layer that is highly resistant to oxidation and corrosion attack. However, one of the major problems faced by these environmentally-resistant coatings is the spallation of the alumina layer thus formed. Upon subsequent cooling of the turbine blade, the thermal mismatch in the coefficients of thermal expansion of the underlying superalloy substrate and the alumina layer disposed thereon leads to an enormous compressive stress on the alumina layer. Thus, when the alumina layer is repeatedly subjected to such intense thermal cycles, spallation of the alumina layer frequently occurs. This in turn triggers regeneration of alumina when the underlying exposed aluminide layer is oxidized by the air at high temperatures produced during the normal working cycle of a gas turbine engine. This regeneration process depletes available aluminum from the underlying aluminide layer disposed on the surface of the substrate, ultimately limiting the life of the coated component. Furthermore, when a thermal barrier coating is applied on the alumina layer, any spallation of the underlying alumina layer results in loss of the overlying thermal barrier coating, with grave consequences. Therefore, creating a spallation-resistant alumina layer is critical.

One example of such a spallation-resistant alumina interfacial layer is disclosed in U.S. Pat. No. 4,880,614, where a high-purity alumina interfacial layer is provided between the metallic substrate and the ceramic thermal barrier coating.

SUMMARY OF THE INVENTION

One embodiment of the present invention embraces an article, comprising:

(a) a superalloy substrate;
(b) an adherent metal aluminide layer disposed on the surface of the substrate; and
(c) an aluminum oxide layer disposed on the surface of the metal aluminide layer, wherein the aluminum oxide layer includes tensile cracking.

The aluminum oxide layer serves as a spallation-resistant protective layer, greatly enhanced by the tensile cracks contained therein, as discussed below. The layer is substantially free of spallation cracks. The article is often in the form of a turbine engine component, e.g., a high-pressure component such as an airfoil. The article may further include a thermal barrier layer disposed over the aluminum oxide layer. One example is a layer formed of yttria-stabilized zirconia.

The present invention is also directed to a method of producing a spallation-resistant protective layer on the surface of a superalloy substrate, comprising the steps of:

depositing an adherent metal aluminide layer on said substrate, depositing an aluminum oxide layer on the surface of said metal aluminide layer; and heating said aluminum oxide layer at an elevated temperature, as discussed below.

Other details regarding the various features of this invention are found in the remainder of the specification.

DETAILED DESCRIPTION OF THE INVENTION

Figure 1:
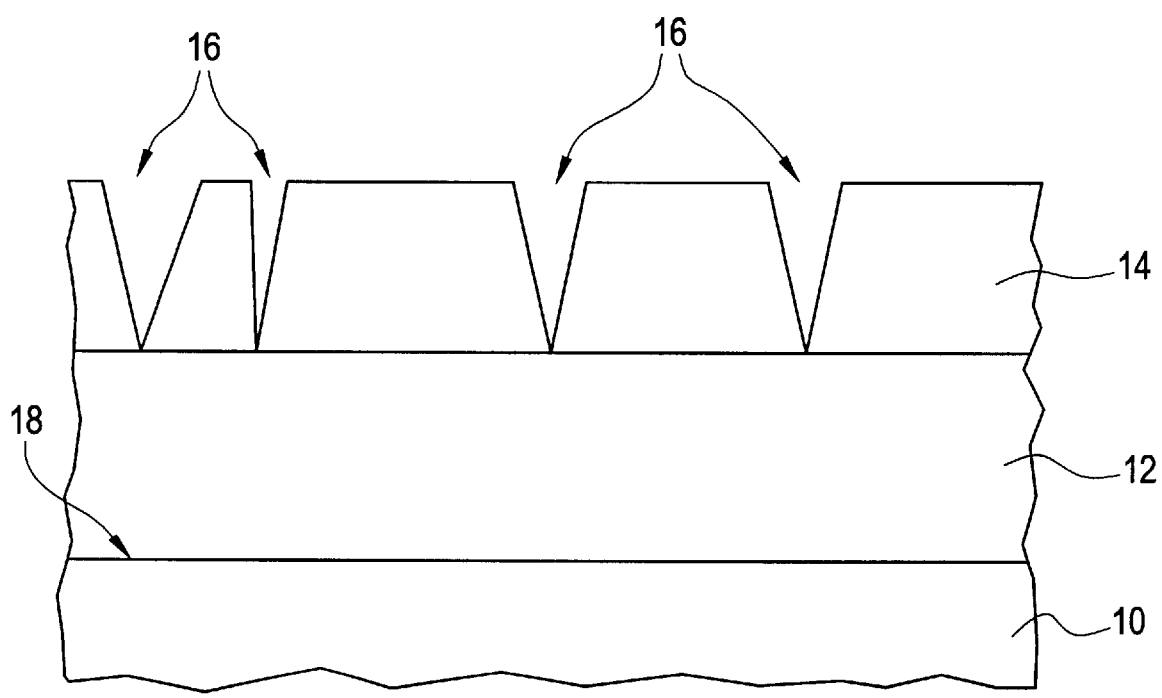
FIG. 1 is a simplified illustration, in cross-section, of a coating system based on the present invention.

High performance superalloys are well-known in the art. They are usually based on nickel, cobalt, iron, or various combinations thereof. Nickel- or cobalt-based superalloy substrates are particularly suitable for depositing an aluminide layer by the method of the present invention. One example of a nickel-based superalloy (all alloy percentages being by weight) comprises 53% nickel, 19% iron, 18% chromium, 5% niobium, 3% molybdenum, 1% titanium, 0.5% aluminum, 0.05% carbon, and 0.005% boron. Another example of a nickel-based superalloy, known as MAR-M247, comprises 10% cobalt, 10% tungsten, 3.3% tantalum, 8.4% chromium, 0.65% molybdenum, 1.05% titanium, 5.5% aluminum, and 1.4% hafnium, alloyed with minor amounts of carbon and boron in a nickel matrix. One example of a cobalt-based superalloy comprises 57.5% cobalt, 10% nickel 25% chromium, and 7.5% tungsten. Still other types of superalloys are discussed in more detail in U.S. Pat. Nos. 4,209,348; 4,582,548; 4,643,782; and 4,719,080, all of which are incorporated herein by reference. It should be noted that sometimes trace amounts of elements such as yttrium and zirconium are present in these superalloys. Nickel-based superalloys are sometimes preferred.

Before commencing the deposition of an adherent metal aluminide layer on the surface of a superalloy substrate, by the process disclosed below, the surface of the substrate is preferably degreased, grit-blasted, and then cleaned.

The metal aluminide layer, e.g., a diffusion coating, is generally produced on the superalloy surface by conventional means, whereby aluminum is reacted at the substrate surface to form an aluminum intermetallic compound. Thus, the metal aluminide layer is predominantly composed of an aluminum intermetallic compound, such as nickel aluminide or cobalt aluminide. Such an intermetallic compound can be formed by reacting aluminum vapor, aluminum-rich alloy powder or aluminum-rich compounds with the substrate elements, such as nickel or cobalt, in the surface layer of the underlying superalloy substrate. This layer is typically well-bonded to the substrate surface.

Aluminiding may be accomplished by conventional techniques, such as chemical vapor deposition (hereinafter sometimes "CVD"), pack aluminiding, spraying, electrophoresis, sputtering or slurry sintering with an aluminum-rich vapor and appropriate diffusion heat treatments. Some of these methods are disclosed by Meier, G. H. and Pettit, F. S. in *High-Temperature Corrosion of Alumina-Forming Coatings for Superalloys,* Surface and Coatings Technology, 39/40 (1989), pp. 1–17, incorporated herein by reference. The metal aluminide layer may be deposited from room temperature up to about 1200° C., depending upon the particular aluminiding process employed, and it usually has a thickness of about 0.025 mm to about 0.125 mm., and preferably about 0.07 mm to about 0.08 mm.

The metal aluminide layer is preferably deposited on the surface of the substrate of an article, such as a high pressure component of a gas turbine engine, by conveying a mixture of hydrogen and aluminum halide compound into a CVD chamber having the substrate heated to a temperature of about 900–1200° C., and maintained at a pressure of about 150–760 torr. A reaction product of the mixture is chemical vapor-deposited on the surface of the substrate to form the metal aluminide layer.

Reference is also made to commonly-owned U.S. Pat. No. 5,407,705, for a preferred method of producing the aforementioned adherent metal aluminide layer. Said patent discloses a method of forming a hypo-stoichiometric aluminide region on the surface of a superalloy substrate, followed by forming a hyper-stoichiometric aluminide layer on the hypostoichiometric aluminide region.

Other elements can be incorporated in the aluminide layer by a variety of processes. Beneficial elements include platinum, silicon, hafnium and, oxide particles such as alumina, yttria or hafnia, for enhancement of aluminum oxide scale adhesion; chromium and manganese for hot corrosion resistance; rhodium and tantalum for diffusional stability and/or oxidation resistance; and nickel or cobalt for increasing ductility and/or incipient melting limits. These elements, preferably platinum, can be added to the surface of the component prior to aluminiding by a wide range of processes, including electroplating, pack cementation, CVD, powder metal layer deposition, thermal spray or physical vapor deposition processes.

Some methods of coating, such as slurry fusion, permit some or all of the beneficial coating elements, including aluminum to be added concurrently. Other processes, such as CVD and pack cementation, can be modified to concurrently apply elements such as silicon, platinum or chromium with aluminum. Platinum-modified aluminide diffusion coatings are disclosed in *Platinum Modified Aluminides-Present Status,* by Smith, J. S., and Boone, D. H., The American Society of Mechanical Engineers, 90-GT-319, Jun. 11–14, 1990.

After completing the deposition of the aluminide layer on the superalloy substrate, deposition of a spallation-resistant aluminum oxide ($Al_2O_3$) layer on the metal aluminide layer can be commenced. An aluminum oxide layer is deposited, typically under tensile stress, on the metal aluminide layer. The layer is usually formed by depositing one or more precursor materials, e.g., by conveying an organo-aluminum composition into the CVD chamber having the substrate positioned therein. Non-limiting examples of the organo-aluminum compositions include: aluminum diacetoacetic ester chelate; a mixture of aluminum isopropoxide and oxygen a mixture of aluminum isopropoxide and nitrogen; aluminum triethoxide; aluminum acetylacetonate; a mixture of triisobutylaluminum and oxygen, and a mixture of trimethylaluminum and nitrous oxide, The substrate is cooled from the first CVD temperature to a second CVD temperature of about 250–500° C., prior to conveying the metal-organic composition into the chamber. The precise second CVD temperature depends upon which of the aforementioned compositions is employed. Some suitable temperatures are disclosed in *Thin Film Processes,* by Vossen and Kern, Academic Press, pp. 291–292, incorporated herein by reference. A reaction product of the composition is thus deposited on the metal aluminide layer to form the aluminum oxide layer under tensile stress. The conditions within the CVD chamber, such as the second CVD temperature and the chamber pressure, should be adjusted so that the formation of the aluminum oxide layer is optimized. The layer is preferably produced at a rate of about 1 angstrom per second. Such a layer generally has a substantially amorphous structure, and has a thickness of about 0.1 micron to about 5.0 microns, and preferably, about 1 micron to about 2 microns.

The preferred composition is aluminum diacetoacetic ester chelate. It is pyrolyzed at the second CVD temperature (also referred to herein as the "deposition temperature") in the range of about 300° C. to about 500° C., preferably about 400° C. to about 450° C., and at a pressure in the range of about 1–30 torr, preferably at about 5–15 torr. Preferably, the same CVD chamber as the one used for depositing the metal aluminide layer is utilized in this step, with care being taken to preserve a clean interface.

After the deposition of the aluminum oxide layer, the temperature in the CVD chamber is gradually increased from the second CVD temperature to a temperature of about 900° C. to about 1200° C., and preferably, about 1000° C. to about 1100° C. This heat treatment at a temperature level which is significantly higher than the deposition temperature is very important in many embodiments of the invention, because it greatly enhances the formation of the tensile cracks, as further discussed below. The heat treatment converts the mostly amorphous aluminum oxide layer under tensile stress into a spallation-resistant aluminum oxide layer, which is a stable form of $\alpha$-alumina.

During the heat treatment, tensile cracking of the layer occurs. Such cracking is very beneficial because, as a superalloy substrate is heated or cooled, it expands (or contracts) at a greater rate than the aluminum oxide layer deposited thereon. It appears that the cracks in the aluminum oxide layer permit the aluminum oxide layer to expand and contract without producing stresses that would induce spalling of the aluminum oxide layer.

Tensile cracking is a very specific phenomenon which cannot be equated with other types of cracks. The cracks are generally vertical to the substrate in orientation, and are sometimes referred to as "Griffith" cracks. This type of crack is described in various references, such as *Delamination and Fracture of Thin Films, E.* Klokholm, IBM J. Res. Develop., Vol. 31, No. 5, September 1987, which is incorporated herein by reference. FIG. 1 is a simplified depiction of a coating system of the present invention, having such cracks. Substrate 10 is a superalloy substrate, e.g., a portion of a component of a gas turbine engine. Layer 12 is an adherent metal aluminide layer, e.g., a diffusion coating, as described previously. Layer 14 is an aluminum oxide coating, as also described above.

Layer 14 is substantially amorphous, but is converted into a substantially crystalline form during the heat treatment. It is during this conversion from the substantially amorphous state to the substantially crystalline state, at the elevated temperature, that tensile cracks 16 are formed. The cracks are generally distributed throughout the aluminum oxide layer. They can vary somewhat in width, depth, and spacing (from each other), but they are all substantially perpendicular to the surface 18 of substrate 10. [The cracks generally do not extend into metal aluminide layer 12, although a minor amount of such extension may occur without detriment to the coating]. (It should also be noted that layers 12 and 14 are not necessarily depicted in scale; reliance on the exemplary thickness ranges provided above is appropriate.)

The tensile cracks required for the present invention are distinct from spallation cracks, which develop from compressive stresses. In general, spallation cracks are substantially horizontal to the substrate surface, and often occur after the article has been subjected to thermal cycling, e.g., a turbine engine component which has been in service for some time. Coatings which are in the state of compression are susceptible to failure by a number of mechanisms. As described in the Klokholm reference, the coating may exhibit a common mechanical instability such as blistering. Ultimately (and especially after a number of heating and cooling cycles), the coating may be subjected to enough compressive stress to completely "decohere" from the substrate.

The cracking and decohesion of coatings in this manner is also discussed in *The Cracking and Decohesion of Thin Films,* A. G. Evans et al, J. Mater. Res., Vol. 3, No. 5, September/October, 1988, which is incorporated herein by reference. As described in the Evans reference, relatively brittle coatings on a relatively ductile substrate (e.g., nickel or cobalt-based superalloys) can exist in a tensile or a compressive state, in terms of residual stress. When the coatings are in a tensile mode, they often exhibit cracking (i.e., mainly tensile cracks), but substantially no decohesion from the substrate, as in the present invention. In contrast, when the coatings are in a compressive mode, they readily decohere from the substrate, e.g., via spallation, "buckle propagation", or delamination-cracking. This phenomenon often occurs in the case of alumina layers which are thermally grown on a substrate, or grown on an intervening layer disposed over the substrate. Such layers usually grow at temperatures greater than about 900° C. Upon cooling, the layers develop high compressive stress, causing spallation. (The Evans reference also mentions "tensile stress concentration" in one section, i.e., a quantity measured after the coating has buckled. This term actually relates to compressive stress, and should not be confused with "tensile cracking".) Thus, an alumina layer deposited and heat-treated according to the present invention has greater adhesion to a superalloy substrate, as compared to a thermally-grown alumina layer which does not contain a substantial amount of tensile cracking. In general, tensile cracking does not occur in a thermally-grown alumina layer, because such a layer never experiences high tensile stress.

As stated before, the temperature in the CVD chamber is gradually increased, i.e., ramped, at a typical rate of about 0.5° C. to about 3° C. per minute, and preferably at about 1° C. to about 2° C. per minute, in about ¾ to about 4 hours, preferably in about 1 to about 2 hours. Once the heat treatment temperature is attained, the substrate is maintained at that temperature for about 1 to about 3 hours, and preferably for about 1.5 to about 2.5 hours, to induce tensile cracking therein. The aforementioned heat treatment may be carried out under an inert environment, typically one provided by a noble gas, such as argon or helium; under a reducing environment, typically one provided by a mixture of about 20–30% by volume of hydrogen mixed with an inert gas; or under an oxidizing environment, typically one provided by a mixture containing about 40–60% by volume of oxygen in an inert gas, such as helium. The oxidizing environment is preferred since it helps in oxidizing any residual carbon deposits that were produced during the aforementioned chemical vapor deposition of the aluminum oxide layer under tensile stress. The oxidizing environment also allows oxidation of portions of the metal aluminide layer exposed through the cracks in the aluminum oxide layer, to form alumina therein. Such a formation of alumina within the cracks in the aluminum oxide layer further improves the oxidation resistance of the spallation-resistant protective layer of the present invention.

If desired, a thermal barrier layer may be deposited on the spallation-resistant protective layer. The thermal barrier layer, which may be applied as the final coating, is preferably a columnar-grained ceramic layer, such as a zirconia layer, deposited on the aluminum oxide layer having cracks therein. The columnar grains are preferably oriented substantially perpendicular to the surface of the substrate with interstices, or at least porosity, between the individual columns extending from the surface of the thermal barrier layer down to or near (within a few microns) the aluminum oxide layer. The thickness of the barrier layer is typically in the range of about 0.075 mm to about 1.5 mm. Such a thermal barrier layer is highly effective in reducing the amount of heat transferred to the substrate, thereby reducing the temperature of the metal.

The thermal barrier layer may be produced by any suitable conventional process, such as air plasma spray, electron beam physical vapor deposition, or low pressure plasma spray. Low pressure spray is preferred. Any suitable ceramic thermal barrier layer may be used. A preferred ceramic layer composition includes zirconia stabilized with yttria, comprising about 6% to about 30% by weight of yttrium oxide, most preferably about 8% to about 20%. Other stabilizers suitable with zirconia are CaO, MgO, and $CeO_2$. These zirconia ceramic layers have a thermal conductivity that is about a factor of 30 lower than that of the typical nickel-based superalloy substrate. Other ceramics which are believed to be useful as thermal barrier layer materials include alumina, ceria, hafnia (yttria-stabilized), mullite and zirconium silicate.

Having described preferred embodiments of the present invention, alternative embodiments may become apparent to those skilled in the art, without departing from the spirit of this invention. Accordingly, it is understood that the scope of this invention is to be limited only by the appended claims.

What is claimed:

1. An article, comprising:
   (a) a superalloy substrate;
   (b) an adherent metal aluminide layer disposed on the surface of the substrate; and
   (c) an aluminum oxide layer substantially free of spallation cracks disposed on the surface of the metal aluminide layer, wherein the aluminum oxide layer includes tensile cracking.

2. The article of claim 1, wherein the superalloy is based on a material selected from the group consisting of nickel, cobalt, iron, and combinations thereof.

3. The article of claim 1, wherein the metal aluminide layer is formed of a material selected from the group consisting of nickel aluminide, cobalt aluminide, and combinations thereof.

4. The article of claim 1, wherein the aluminum oxide layer is the stable form of α-alumina.

5. The article of claim 1, wherein the thickness of the metal aluminide layer is in the range of about 0.025 mm to about 0.125 mm.

6. The article of claim 1, wherein the thickness of the aluminum oxide layer is in the range of about 0.1 micron to about 5 microns.

7. The article of claim 1, further comprising a thermal barrier layer disposed over the aluminum oxide layer.

8. The article of claim 7, wherein the thermal barrier layer comprises zirconia.

9. The article of claim 8, wherein the thermal barrier layer further comprises yttrium oxide.

10. The article of claim 7, wherein the thermal barrier layer has a thickness in the range of about 0.075 mm to about 1.5 mm.

11. The article of claim 1, wherein the aluminum oxide layer is formed by depositing precursors of the layer onto the metal aluminide layer at a selected deposition temperature, followed by heating of the deposited layer at an elevated temperature which is higher than the deposition temperature.

12. The article of claim 11, wherein the deposition temperature is in the range of about 300° C. to about 500° C.

13. The article of claim 11, wherein the aluminum oxide layer is substantially amorphous after being deposited, and prior to being heated at the elevated temperature.

14. The article of claim 13, wherein the elevated temperature is sufficient to convert the substantially amorphous layer into a substantially crystalline form.

15. The article of claim 13, wherein the elevated temperature is in the range of about 900° C. to about 1200° C.

16. The article of claim 1 which is a component of a gas turbine engine.

17. A turbine engine component, comprising:
   (a) a superalloy substrate comprising nickel or a combination of nickel and cobalt;
   (b) an adherent metal aluminide layer disposed on the surface of the substrate; and
   (c) an aluminum oxide layer substantially free of spallation cracks deposited on the surface of the metal aluminide layer, wherein the aluminum oxide layer includes tensile cracks.

18. The turbine engine component of claim 17, wherein the thickness of the metal aluminide layer is in the range of about 0.025 mm to about 0.125 mm; and the thickness of the aluminum oxide layer is in the range of about 0.1 micron to about 5 microns.

19. The turbine engine component of claim 17, further comprising a thermal barrier layer of yttria-stabilized zirconia disposed over the aluminum oxide layer, wherein the thermal barrier layer has a thickness in the range of about 0.075 mm to about 1.5 mm.

20. An article, comprising:
   (a) a superalloy substrate;
   (b) an adherent metal aluminide layer disposed on the surface of the substrate; and
   (c) an aluminum oxide layer disposed on the surface of the metal aluminide layer,
wherein the aluminum oxide layer includes tensile cracking and is formed by depositing precursors of the layer onto the metal aluminide layer at a selected deposition temperature, followed by heating of the deposited layer at an elevated temperature, which is higher than the deposition temperature and wherein the aluminum oxide layer is substantially amorphous after being deposited, and prior to being heated at the elevated temperature.

* * * * *